United States Patent [19]
Yariv et al.

[11] Patent Number: 5,270,559
[45] Date of Patent: Dec. 14, 1993

[54] METHOD AND APPARATUS FOR MAKING HIGHLY ACCURATE POTENTIAL WELL ADJUSTMENTS IN CCD'S

[75] Inventors: Amnon Yariv, San Marino; Charles F. Neugebauer; Aharon J. Agranat, both of Pasadena, all of Calif.

[73] Assignee: California Institute of Technology, Pasadena, Calif.

[21] Appl. No.: 967,383

[22] Filed: Oct. 29, 1992

Related U.S. Application Data

[63] Continuation of Ser. No. 596,951, Oct. 15, 1990, abandoned.

[51] Int. Cl.$^5$ ............................................. H01L 29/78
[52] U.S. Cl. .................................... 257/249; 257/250; 257/315
[58] Field of Search ............... 257/249, 250, 216, 218, 257/239, 315, 316

[56] References Cited

U.S. PATENT DOCUMENTS

| | | | |
|---|---|---|---|
| 4,228,445 | 10/1980 | Tasch, Jr. et al. | 257/250 |
| 4,559,549 | 12/1985 | Roberts et al. | |
| 4,612,454 | 9/1986 | Kinoshita et al. | |
| 4,612,522 | 9/1986 | Dyck | |
| 4,984,045 | 1/1991 | Matsunaga | |

*Primary Examiner*—Andrew J. James
*Assistant Examiner*—Courtney A. Bowers
*Attorney, Agent, or Firm*—Leonard Tachner

[57] ABSTRACT

An adjustable CCD gate structure utilizing ultra-violet light activated floating gates, wherein a floating polysilicon gate is used between a CCD electrode and the underlying substrate to provide a fixed voltage bias to the CCD gate during the manufacturing process thereof The floating gate is programmed with a desired voltage bias during the application of ultra-violet light and is thereafter fixed at that adjusted level, upon the removal of the ultra-violet light. Thus, the method of the present invention comprises the steps of providing a CCD gate structure in which there is such a floating polysilicon gate between the CCD electrode and the underlying substrate; applying an ultra-violet light activation to the floating polysilicon gate; applying a voltage to the conventional CCD electrode which is resistively coupled to the floating electrode for adjusting the bias on the floating electrode to a desired level; and then removing the ultra-violet light to fix the voltage bias at the floating polysilicon gate at a permanant level.

9 Claims, 1 Drawing Sheet

METHOD AND APPARATUS FOR MAKING HIGHLY ACCURATE POTENTIAL WELL ADJUSTMENTS IN CCD'S

This is a continuation of application Ser. No. 07/596,951 filed Oct. 15, 1990, abandoned.

TECHNICAL FIELD

The present invention relates generally to the manufacture of multiple CCD gate integrated circuits and more specifically to a novel CCD/floating gate structure which can be used to augment CCD resolution by providing a means for tuning the potential of individual gates of a CCD integrated circuit chip to compensate for inadvertant manufacturing variations therein.

BACKGROUND ART

Integrated circuit devices that provide a large plurality of multiple CCD gate structures are in common use today. By way of example, virtually all modern video cameras use such devices. Multiple CCD gate structures are also in use for vector matrix multiplication such as the CCD/CID vector matrix multiplier disclosed in the applicant's previously filed patent application Ser. No. 07/534,250 filed on Jun. 7, 1990. They may also be used in charge domain analog-to-digital converters, such as that disclosed in the applicant's co-pending patent application Ser. No. 07/597,020 filed concurrently herewith. In all such known uses for multiple CCD gate structures, it is desirable that the potential well characteristics that dictate the storage of charge beneath each such CCD gate be identical among the various gates on a chip. Unfortunately, even slight manufacturing variations from gate to gate on a single chip produce differences in each gate's potential and although these differences may only be equivalent to about a few millivolts, even such small differences can create inaccuracies and computational errors which detract from the otherwise significant advantages of CCD devices.

It is well known in the electronics art to use an ultra-violet light-activated floating gate for digital storage, such as in UV EPROMS. The binary storage provided by the read only memory may be altered by applying a digital value such as a 1 or 0, to each location within the programmable read only memory device, but only when an ultra-violet light is applied to the device or when extremely high electric fields are applied. During the application of UV light, the electrons in the insulator surrounding the floating storage gate are excited into the conduction band to permit current flow therein and hence modify the floating storage gate's potential. While the use of ultra-violet light activation of floating gates for digital storage is well known, it is believed that it has never been applied to CCD's, such as for the purpose of programming each gate of a multiple gate CCD structure in order to compensate for the fixed voltage bias of each such gate inherent to the manufacturing process.

It is believed that some relevant prior art work has been done at the Massachusetts Institute of Technology by John Sage and Alice Chiang, on the use of MNOS CCD structures where an outside surface is used to store an adjustable charge which can compensate for variations in CCD gate voltage biases. Unfortunately, this prior art process requires a special oxide coating which is relatively non-standard in the electronics industry and which therefore requires special machinery at increased cost and manufacturing complexity.

There is therefore a need to provide a more suitable and conventional means for controlling the fixed voltage bias in each gate of a CCD gate structure, which process may be incorporated in fabricating the CCD integrated circuit chip without adding any substantial cost thereto and wherein a relatively permanant voltage bias adjustment may be made to each individual CCD gate to compensate for manufacturing variations that would otherwise create differences in the inherent bias and therefore the potential well depth associated with each such gate.

SUMMARY OF THE INVENTION

The present invention meets the aforementioned need by providing an adjustable CCD gate structure utilizing ultra-violet light-activated floating gates. More specifically, in the CCD gate structure of the present invention, a floating polysilicon gate is employed between a conventional CCD electrode and the underlying substrate to provide the opportunity to program a fixed voltage bias for each individual CCD gate. The floating gate may be programmed upon application of ultra-violet light, wherein a high-resistance conduction path is created between the conventional CCD electrode and the floating gate, whereby resistive coupling therebetween permits application of a selected voltage bias to the floating gate. Thereafter, removal of the ultra-violet light activation creates an insulating characteristic between the conventional gate and the floating gate, whereby the voltage bias resistively induced upon the floating gate remains relatively permanant. This procedure provides an adjustment typically on the order of millivolts, which compensates for variations in the well potential between gates on a CCD integrated circuit chip. This novel combination of known UV floating gate techniques with a CCD gate structure provides a unique programmable CCD structure, which for the first time, permits the last step of the CCD gate structure fabrication method to include tuning of the potentials on the chip to compensate for manufacturing variations. Such an additional adjustability feature may be used advantageously for compensation of millivolt threshold differences in CCD gates for a variety of CCD devices, including video cameras, as well as CID vector matrix multiplication devices and charge domain analog-to-digital converters.

OBJECTS OF THE INVENTION

It is therefore a principal object of the present invention to provide a novel method and apparatus for making highly accurate potential well adjustments in CCD's that are especially suited to compensate for millivolt threshold differences in CCD gates that otherwise result from standard variations in manufacturing procedures and materials.

It is an additional object of the present invention to provide a method and apparatus for fine tuning the potential well of a CCD gate by using a programmable floating gate structure which can be used during the manufacturing process of the CCD gate structure to either increment or decrement the voltage bias permanantly associated with each CCD gate to compensate for differences therein that otherwise occur commonly in standard manufacturing procedures associated with multi-gate CCD structures.

It is still an additional object of the present invention to provide a method and apparatus for adjusting the potential wells in CCD gates of a CCD gate integrated circuit chip, by employing a floating polysilicon gate that is completely insulated by gate oxide and is positioned in the gate structure between the conventional control voltage gate electrode and the underlying CCD substrate, whereby upon application of an ultra-violet light source to the floating gate, the upper conventional control gate and the floating gate become resistively coupled, permitting increase or decrease in the fixed bias in the floating gate by the application of a voltage to the conventional gate electrode.

BRIEF DESCRIPTION OF THE DRAWING

The aforementioned objects and advantages of the present invention, as well as additional objects and advantages thereof, will be more fully understood hereinafter as a result of a detailed description of a preferred embodiment when taken in conjunction with the accompanying drawings in which.

DETAILED DESCRIPTION OF A PREFERRED EMBODIMENT

Figure 1:
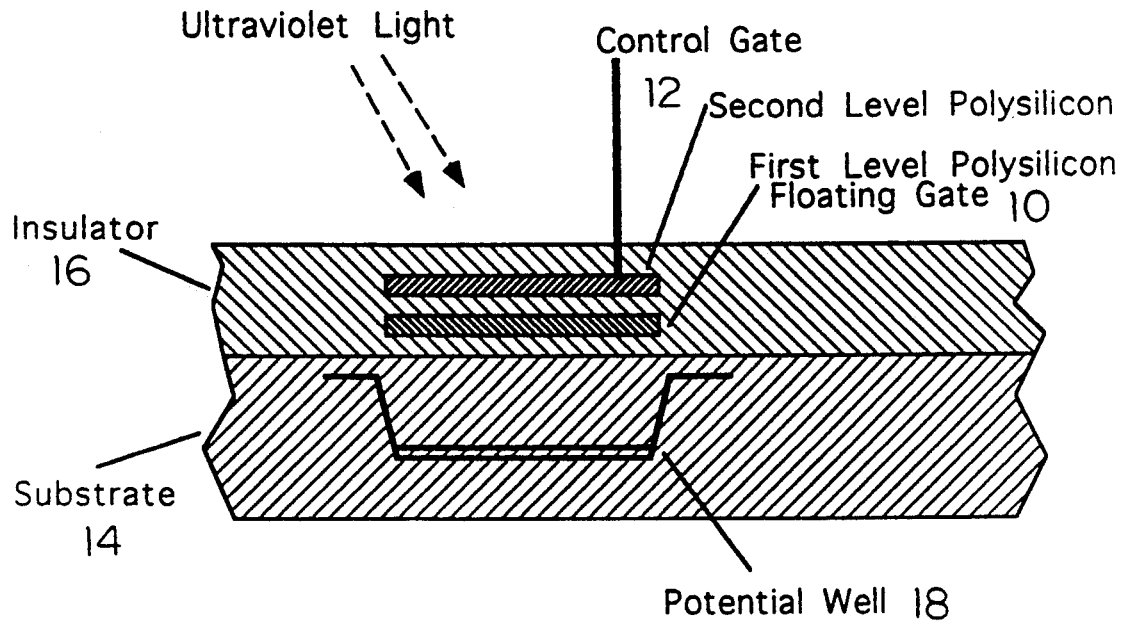
FIG. 1 is a schematic illustration of the adjustable CCD gate of the present invention and illustrating the relative position of the additional floating polysilicon gate that is used herein to provide a fixed permanant bias which may be adjusted during the manufacturing process, upon application of ultra-violet light thereto.
Figure 2:
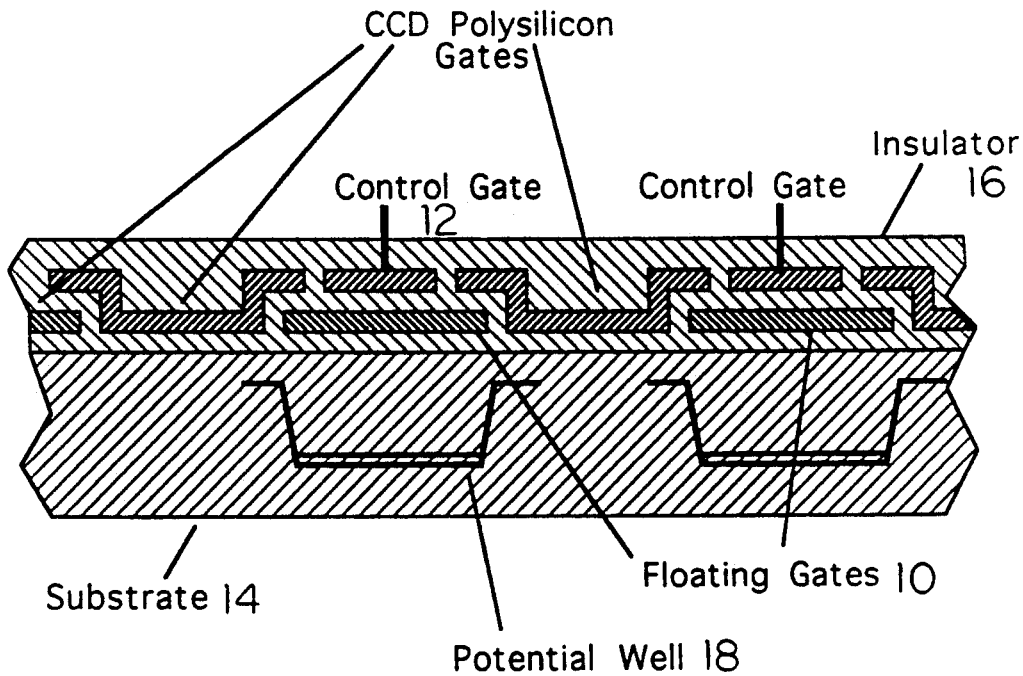
FIG. 2 is a schematic illustration similar to FIG. 1 but illustrating a multiple gate device employing the present invention.

Referring now to FIGS. 1 and 2, it will be seen that unlike the conventional CCD gate of the prior art, wherein a single electrode is positioned above an underlying CCD substrate, the present invention employs an additional floating gate 10 which is situated between the conventional electrode 12 and the underlying substrate 14. This additional gate 10 is, like the conventional gate 12, made of a polysilicon material and is preferably spaced from the conventional electrode structure, which is also a polysilicon material. The floating polysilicon gate is encapsulated in silicon dioxide, a material which acts as an insulator 16 having a resistance on the order of $10^{21}$ to $10^{23}$ Ohms between the two polysilicon gates and a resistance on the order of $10^{14}$ Ohms upon the application of ultra-violet light thereto. Thus, the silicon dioxide material in which the floating gate of the invention is encapsulated, acts as a good insulator in ambient light, but as a weak conductor upon the application of ultra-violet light.

It will be seen that there is no direct electrical connection to the floating polysilicon gate that is situated between the conventional polysilicon control gate and the underlying CCD substrate. In fact, externally one would see no difference in the structure of the present invention, as compared to prior art conventional CCD gate integrated circuit chips, because there is no additional external manifestation of the existance of the floating gate. Nevertheless, because of the close proximity of the conventional gate and the floating gate of the present invention and the silicon dioxide material in which they are encapsulated and spaced from one another, when ultra-violet light is applied to the floating gate and the resistance of the silicon dioxide is reduced, the two gates become resistively coupled. Thereafter, the application of a voltage to the control gate induces a change in the voltage bias on the floating gate. The change in the voltage bias on the floating gate follows the voltage applied to the control gate in accordance with an RC time constant which is on the order of tens of seconds that is established between the resistively coupled polysilicon gates. This time constant is dependent upon the reduced resistance of the interposed silicon dioxide during the application of ultra-violet light and the parasitic capacitance of the floating gate.

Thus for example, if upon the application of ultra-violet light to the structure of the present invention during the fabrication process thereof, a positive or negative voltage on the order of 10 to 20 volts were applied to the control gate, the voltage on the floating gate positioned between the control gate and the underlying substrate, would begin to change at a relatively slow rate. The floating gate would adapt to a voltage proportional to the control electrode's voltage, at which time the ultraviolet light would be removed. In addition to controlling the programming of a fixed voltage on the floating gate through resistive coupling, the control electrode can act as a conventional CCD electrode, its effective voltage being the externally applied voltage plus the bias voltage programmed on the floating gate due to capacitive coupling. Thus, the upper gate can control the potential well beneath the floating gate by means of capacitive coupling. By measuring the device, one can compute an adjustment that needs to be made to each gate's potential. This adjustment can be performed by shining an ultra-violet light on the floating gate. The ultra-violet light causes charge to flow to or from the floating gate through the oxide, thus giving it a fixed bias. When the ultra-violet light is removed, the charge on the floating gate is trapped and provides the required potential adjustment to compensate for manufacturing differences between respective gates. This adjustment manifests itself as a fixed bias that may be either added or subtracted from the upper polysilicon gate potential through the aforementioned capacitive coupling.

Thus, each gate in a multiple gate structure that utilizes the novel programmable floating gate of the present invention, may be independently compensated for inaccuracies due to threshold differences in the multiple gates of the CCD structure during the usual manufacturing process of the prior art. Thus for example, in today's relatively large matrixes of CCD gates that may be provided, for example on a single integrated circuit chip, there exists noticeable potential well differences on the order of millivolt levels. The programmability feature of the present invention permits one to carefully adjust each such gate potential well depth independently, whereby the differences that exist in prior art manufacturing techniques may be compensated for, whereby all the potential wells of each gate within the matrix are made virtually identical.

Once the ultra-violet light is removed from the device, the silicon dioxide in which the gate structure is encapsulated, again becomes a high resistance insulator, thereby removing the resistive coupling between the floating gate and the voltage control gate. The fixed bias modified during the fabrication process is thus permanant in that it cannot thereafter be changed without re-application of ultra-violet light. In fact, the programmable fixed bias that is applied to each gate of the present invention by the means described herein, should be relatively permanant and have a life equal to or exceeding that of the device itself, which is believed to be on the order of five to ten years.

The novel capability provided by the present invention, that is the capability for altering the potential well on a gate-by-gate basis in a CCD gate structure, can be used in a number of ways that are not necessarily related to compensating for manufacturing variations. By way of example, there may be applications in which the effective width or charge capacity of each such gate may be altered for other reasons, such as for simply changing the amount of charge that may be stored in a CCD gate in a divide by two circuit. In fact, there may be a number of applications in which pre-programmed variations are provided on a permanant basis within the respective gates of a multi-gate structure. Thus, the method and apparatus of the present invention find their most significant use in compensating for manufacturing variations for providing precisely equal well potentials among gates on a single integrated circuit structure. It will be understood however that the present invention may be used to provide intended variations in such well potentials. Most importantly therefore, is the fact that the present invention provide a programmability feature which has not been heretofore available in any readily convenient manner.

It will now be understood that what has been disclosed herein, comprises an adjustable CCD gate structure utilizing ultra-violet light activating floating gates, wherein a floating polysilicon gate is used between a CCD electrode and the underlying substrate to provide a fixed voltage bias to the CCD gate during the manufacturing process thereof. The floating gate is programmed with a desired voltage bias during the application of ultra-violet light and is thereafter fixed at that adjusted level, upon the removal of the ultra-violet light. Thus, the method of the present invention comprises the steps of providing a CCD gate structure in which there is such a floating polysilicon gate between the CCD electrode and the underlying substrate; applying an ultra-violet light activation to the floating polysilicon gate; applying a voltage to the conventional CCD electrode which is resistively coupled to the floating electrode for adjusting the bias on the floating electrode to a desired level; and then removing the ultra-violet light to fix the voltage bias at the floating polysilicon gate at a permanant level. It will also be understood that the principal purpose of the present invention as currently contemplated, is for compensating for millivolt threshold differences in CCD gates that result from standard manufacturing variations in procedures and materials. Nevertheless, it will also be understood that the programmability feature provided by the present invention may be used for other purposes, such as for instilling selected variations or differences between the gates on a CCD gate structure. Thus for example, the present invention may be used to purposefully increase the potential well depth underlying a CCD gate, in order to significantly increase the amount of charge that can be stored therein.

Those having ordinary skill in the art to which the present invention pertains, will now as a result of the applicants' teaching herein, perceive various modifications and additions which may be made to the invention. By way of example, while reference has been made herein above to specific materials, it will be understood that the present invention is not necessarily limited to the use of such materials, since it is well known in the semi-conductor arts that a variety of different materials may be used for such applications, including substitutes for silicon-dioxide which react to the application of ultra-violet light to change inherent resistance. Furthermore, while the present invention has been described in relation to charge couple devices, it will be understood that it may find significant advantageous use in other charge utilizing devices, such as charge injection devices, commonly referred to as CID's. Furthermore, while the present invention has been described for use in conjunction with ultra-violet light, it will be understood that other forms of electromagnetic or other energy sources for changing the conduction characteristics of a material may be used herein. Accordingly all such modifications and additions are deemed to be within the scope of the invention, which is to be limited only by the claims appended hereto.

We claim:

1. In a multiple gate charge-coupled device of the type wherein at least two gates of a plurality of gates each has a control gate overlying a substrate in spaced relation and encapsulated with an insulating material for controlling the charge stored in the substrate in accordance with the voltage applied to the control gate; the improvement wherein each of said at least two gates of said plurality comprises:

a floating gate located between the control gate and substrate in spaced relation to both the control gate and the substrate;

the electrical resistance of said insulating material responsive to the application of electromagnetic energy for resistively coupling said control gate and said floating gate whereby a voltage is applied to said floating gate during application of said energy and said voltage remains constant upon removal of said energy; and wherein voltage applied to each said floating gate is independently adjusted to render the potential wells of said at least two gates substantially identical.

2. A method for fabrication of charge coupled devices of the type having a control gate overlying a substrate in spaced relation and encapsulated with an insulating material for controlling the charge stored in the substrate in accordance with the voltage applied to the control gate; the method comprising the steps of:

a) providing a floating gate located between the control gate and the substrate in spaced relation to both the control gate and the substrate;

b) providing an insulating encapsulating material which is responsive to the application of electromagnetic energy for resistively coupling said control gate and said floating gate;

c) applying said electromagnetic energy to said insulating material;

d) applying a first selected voltage to said control gate to induce a second selected voltage on said floating gate; and e) removing said electromagnetic energy to fix said second selected voltage on said floating gate.

3. The method recited in claim 2 wherein in step a) said floating gate is provided in the form of polysilicon.

4. The method recited in claim 2 wherein in step c) said electromagnetic energy is provided in the form of ultra-violet light.

5. The method recited in claim 2 wherein in step b) said insulating material is provided in the form of silicon dioxide.

6. A method for fabrication of a multiple gate charge coupled device of the type wherein at least one gate of a plurality of gates has a control gate overlying a substrate in spaced relation and encapsulated with an insulating material for controlling the charge stored in the substrate in accordance with the voltage applied to the control gate; the method comprising the steps of:
 a) providing a floating gate located between the control gate and the substrate in spaced relation to both the control gate and the substrate;
 b) providing an insulating encapsulating material which is responsive to the application of electromagnetic energy for resistively coupling said control gate and said floating gate;
 c) applying said electromagnetic energy to said insulating material;
 d) applying a first selected voltage to said control gate to induce a second selected voltage on said floating gate; and
 e) removing said electromagnetic energy to fix said second selected voltage on said floating gate.

7. The method recited in claim 6 wherein in step a) said floating gate is provided in the form of polysilicon.

8. The method recited in claim 6 wherein in step c) said electromagnetic energy is provided in the form of ultra-violet light.

9. The method recited in claim 6 wherein in step b) said insulating material is provided in the form of silicon dioxide.

* * * * *